United States Patent
Akino

(10) Patent No.: US 9,736,586 B2
(45) Date of Patent: Aug. 15, 2017

(54) CONDENSER MICROPHONE

(71) Applicant: KABUSHIKI KAISHA AUDIO-TECHNICA, Machida-shi, Tokyo (JP)

(72) Inventor: Hiroshi Akino, Machida (JP)

(73) Assignee: KABUSHIKI KAISHA AUDIO-TECHNICA, Machida-shi, Tokyo (JP)

( * ) Notice: Subject to any disclaimer, the term of this patent is extended or adjusted under 35 U.S.C. 154(b) by 0 days.

(21) Appl. No.: 15/366,661

(22) Filed: Dec. 1, 2016

(65) Prior Publication Data

US 2017/0180857 A1    Jun. 22, 2017

(30) Foreign Application Priority Data

Dec. 21, 2015   (JP) .................................. 2015-248286

(51) Int. Cl.
| | |
|---|---|
| *H04R 3/04* | (2006.01) |
| *H04R 3/00* | (2006.01) |
| *H04R 19/04* | (2006.01) |
| *H03F 1/04* | (2006.01) |

(52) U.S. Cl.
CPC ................. *H04R 3/04* (2013.01); *H03F 1/04* (2013.01); *H04R 3/005* (2013.01); *H04R 19/04* (2013.01)

(58) Field of Classification Search
CPC ........... H03F 1/04; H04R 19/04; H04R 3/005; H04R 3/04
See application file for complete search history.

(56) References Cited

FOREIGN PATENT DOCUMENTS

| | | |
|---|---|---|
| JP | 4227679 B2 | 2/2009 |
| JP | 5201598 B2 | 6/2013 |

*Primary Examiner* — Mohammad Islam
(74) *Attorney, Agent, or Firm* — Manabu Kanesaka

(57) ABSTRACT

A condenser microphone includes a first grounded-plate electron tube having a plate to which a dc power is supplied, and a cathode provided with an output terminal, a self-biasing circuit that is connected to the cathode of the first electron tube and that generates a grid bias voltage of the first electron tube by voltage drop with a cathode current, and a second grounded-cathode electron tube having a plate to which a series circuit of the first electron tube and the self-biasing circuit is connected as a load circuit. A positive phase output from a first condenser microphone unit is supplied to a grid of the first electron tube, and a reverse phase output from a second condenser microphone unit is supplied to a grid of the second electron tube.

10 Claims, 4 Drawing Sheets

CONDENSER MICROPHONE

RELATED APPLICATIONS

The present application is based on, and claims priority from, Japanese Application No. JP2015-248286 filed Dec. 21, 2015, the disclosure of which is hereby incorporated by reference herein in its entirety.

BACKGROUND OF THE INVENTION

Field of the Invention

The present invention relates to a condenser microphone that uses an electron tube (vacuum tube) for an impedance conversion circuit, and especially relates to a condenser microphone that improves output sensitivity by adding outputs of a plurality of condenser microphone units.

Description of the Related Art

A condenser microphone generates an audio signal based on changes of static capacitance between a diaphragm and a fixed electrode facing each other.

That is, a condenser microphone unit in which the diaphragm is disposed to face the fixed electrode has the static capacitance of about several tens of pF and has extremely high output impedance, and thus the audio signal from the condenser microphone unit is taken out through an impedance conversion circuit.

For the condenser microphone, an impedance conversion circuit using a field effect transistor or an electron tube (a vacuum tube) is used, and especially, as a condenser microphone for studio sound collection, a product is provided using the electron tube in the impedance conversion circuit to improve the sound quality.

Regarding the condenser microphone using the electron tube in the impedance conversion circuit described above, the applicant of the present application has made some proposals, and one of the proposals is disclosed in Japanese Patent No. 4227679 B2 (Patent Document No. 1).

Meanwhile, the applicant of the present application has already proposed a condenser microphone that improves output sensitivity by connecting a plurality of condenser microphone units in series, and this proposal is disclosed in Japanese Patent No. 5201598 B2 (Patent Document No. 2).

FIG. 4 illustrates an impedance conversion circuit of the condenser microphone disclosed in the patent document No. 1.

U1 surrounded by the broken line in FIG. 4 indicates a condenser microphone unit in an equivalent manner, and the condenser microphone unit U1 includes a voltage generation source E1 that generates an audio voltage, and a capacitor C1 formed of a diaphragm and a fixed electrode facing each other.

One terminal of the condenser microphone unit U1 is connected to a grid of a first electron tube (triode) T1, and the other terminal is connected to a ground GND that is a reference potential point of the circuit.

A plate of the first electron tube T1 is connected to a direct current (dc) power supply +B through a resistor R1. Further, a plurality of diodes D3 is connected in series to a cathode in a forward direction, and a by-pass capacitor C3 is connected in parallel to both ends of the diodes D3. That is, the diodes D3 function as a voltage drop element, and configure a self-biasing circuit of the first electron tube T1 with the by-pass capacitor C3 connected in parallel across the diodes D3.

Then, the cathode of the series-connected diodes D3 is connected to a plate of a second electron tube (triode) T2.

Note that, in this example, multi-section vacuum tubes (dual triodes) are used as the first and second electron tubes T1 and T2.

A plurality of diodes D1 connected in series and a plurality of diodes D2 connected in series are connected in inverse parallel to each other between the grid of the first electron tube T1 and the cathode of the diodes D3.

The inverse parallel circuit of the diodes D1 and the diodes D2 functions to reduce variation of a grid voltage Vg such that a cathode voltage Vc of the diodes D3, which constitute the self-biasing circuit of the electron tube T1, and a grid voltage Vg of the electron tube T1 become equal. Accordingly, the stabilized bias voltage Vc (the cathode voltage Vc) by the self-biasing circuit of the electron tube T1 is applied to the grid of the electron tube T1.

Meanwhile, a cathode of the second electron tube T2 is connected to the ground GND, and a grid of the electron tube T2 is connected to the cathode (ground) through a resistor R2. That is, the grid and the cathode of the second electron tube T2 are maintained to have a nearly identical potential, and thus a constant plate current flows. Accordingly, the second electron tube T2 serves as a constant current load of the first electron tube T1.

Note that, in the example illustrated in FIG. 4, the cathode of the first electron tube T1 serves as an impedance-converted output terminal OUT for an audio signal. Then, a resistor R1 having a small value is connected between the plate of the first electron tube T1 and the dc power supply +B, and therefore, the first electron tube T1 substantially constitutes an impedance conversion circuit using a cathode follower (grounded-plate) circuit.

Then, a capacitor C4 is connected between the plate of the first electron tube T1 and the grid of the second electron tube T2, and an audio voltage generated by the resistor R1 having a small value is applied to the grid of the second electron tube T2 through the capacitor C4. Accordingly, the configuration contributes improvement of distortion of an audio output.

SUMMARY OF THE INVENTION

By the way, for example, to improve the output sensitivity by adding the outputs of the two condenser microphone units, as disclosed in the patent document No. 2, using the impedance conversion circuit illustrated in FIG. 4 disclosed in the patent document No. 1, two electron tubes (triodes) are necessary for every condenser microphone unit.

Therefore, an additional space for accommodating the electron tubes becomes necessary in the microphone case, and a disadvantage arises that the entire size of the condenser microphone increases.

The present invention aims at reducing the number of electron tubes (triodes) by half by using the basic configuration of the impedance conversion circuit illustrated in FIG. 4 and as disclosed in the patent document No. 1, and by constituting an addition circuit of the outputs from each of the condenser microphone units.

In addition, another objective of the present invention is to provide a condenser microphone that outputs microphone outputs as a balanced signal, using a configuration of an impedance conversion circuit in which the number of electron tubes is reduced by half.

A first embodiment of a condenser microphone of the present invention to solve the above problem includes: a first grounded-plate electron tube, having a plate to which dc power is supplied and a cathode at which an output terminal is provided; a self-biasing circuit including a voltage dropping element, being connected to the cathode of the first electron tube, that generates a grid bias voltage of the first electron tube by voltage drop with a cathode current; and a second grounded-cathode electron tube, having a plate to which a series circuit of the first electron tube and the self-biasing circuit is connected as a load circuit, wherein a positive phase output from a first condenser microphone unit is supplied to a grid of the first electron tube and a reverse phase output from a second condenser microphone unit is supplied to a grid of the second electron tube, and an added signal of a signal from the first condenser microphone unit and a signal from the second condenser microphone unit is outputted to an output terminal of the cathode of the first electron tube.

In addition, a second embodiment of a condenser microphone of the present invention includes: two sets of condenser microphones of the first embodiment mentioned above, wherein a positive phase output from the first condenser microphone unit is supplied to the grid of the first electron tube in a first set, and a reverse phase output from the second condenser microphone unit is supplied to the grid of the second electron tube in the first set, a reverse phase output from a third condenser microphone unit is supplied to the grid of the first electron tube in a second set, and a positive phase output from a fourth condenser microphone unit is supplied to the grid of the second electron tube in the second set, and balanced output signals of the microphones are outputted between an output terminal of the cathode of the first electron tube in the first set and an output terminal of the cathode of the first electron tube in the second set.

In this case, diodes are preferably used as the voltage dropping element that constitutes the self-biasing circuit, and a configuration in which a by-pass capacitor is connected to the diodes in parallel can be preferably employed.

Then, the first electron tube and the second electron tube are preferably each of a dual triode tube.

Meanwhile, diaphragms of the condenser microphone units are desirably arranged on the same plane such that distances from a sound source are to be identical, and in a preferable form, as the condenser microphone units, back electret-type condenser microphone units having an electret dielectric film formed on a fixed electrode are employed.

According to the condenser microphone of the present invention, the first grounded-plate electron tube and the second grounded-cathode electron tube are connected in series to mutually constitute a load circuit. Then, by supplying signals from the respective condenser microphone units to the grids of the electron tubes with a relation in phases opposite to each other, the added signal from the condenser microphone units can be outputted with a converted impedance from the cathode of the first electron tube.

Further, two sets of series connection of the first grounded-plate electron tube and the second ground-cathode electron tube are prepared, and phases of the signals from the first to fourth condenser microphone units to be supplied to the grids of the electron tubes are set to have a specific relationship, so that balanced output signals of the condenser microphone can be outputted between the cathode of the first electron tube of the first set and the cathode of the first electron tube of the second set.

Therefore, compared with a configuration using the conventional impedance conversion circuit using the electron tubes illustrated in FIG. 4, the signals can be outputted in a state where the outputs of the condenser microphone are added, with the half number of electron tubes.

Accordingly, as disclosed in the patent document No. 2, a condenser microphone that has improved output sensitivity by adding outputs of condenser microphone units can be easily achieved.

In addition, in a case of employing the configuration to output the balanced output signals of the condenser microphone with improved output sensitivity, as described above, the configuration can contribute to provide a smaller condenser microphone, which can be built by including two dual triode tubes.

DESCRIPTION OF THE PREFERRED EMBODIMENTS

A condenser microphone according to the present invention will be described with reference to FIGS. 1 to 3.

Figure 1:
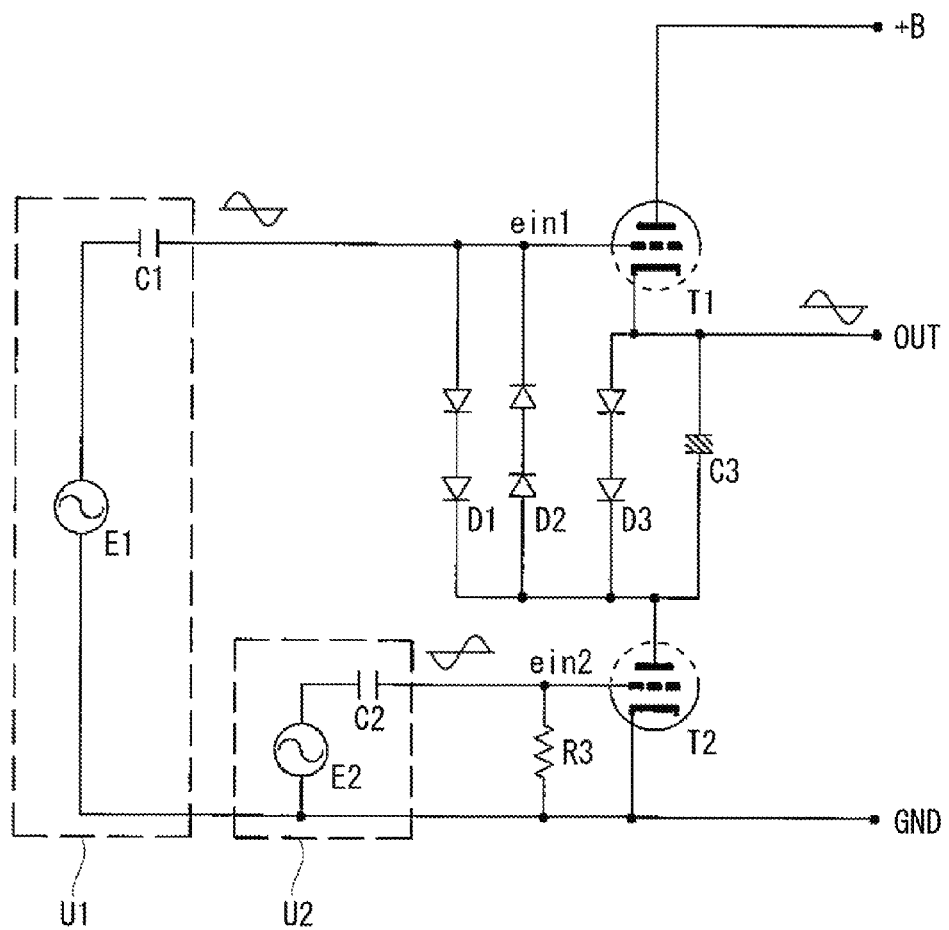
FIG. 1 is a circuit configuration diagram illustrating a first embodiment of a condenser microphone according to the present invention.

FIG. 1 is a circuit configuration diagram illustrating a first embodiment of a condenser microphone. The circuit configuration illustrates that the circuit serves as impedance converters of outputs from a first condenser microphone unit U1 and a second condenser microphone unit U2, and as a function of adding signals of the first condenser microphone unit U1 and the second condenser microphone unit U2 and outputting the added signals.

Figure 4:
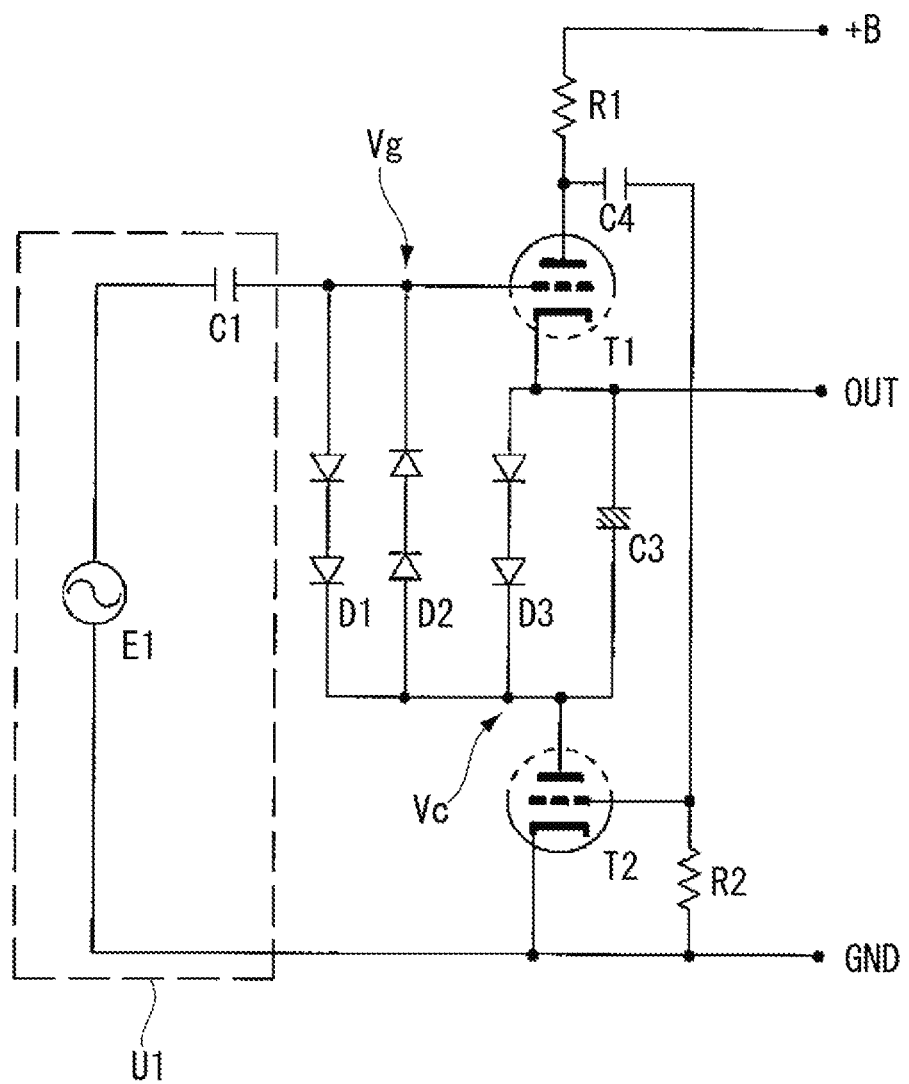
FIG. 4 is a circuit configuration diagram illustrating an example of an impedance conversion circuit in a conventional condenser microphone.

Note that, in FIG. 1, portions serving the same functions as the above-described respective units illustrated in FIG. 4 are denoted with the same reference signs, and thus detailed description is appropriately omitted.

The first condenser microphone unit U1 is composed of both a voltage generation source E1 that generates an audio voltage, and a capacitor C1 formed of a diaphragm and a fixed electrode facing each other. Similarly, the second condenser microphone unit U2 is constituted of both a voltage generation source E2 that generates an audio voltage, and a capacitor C2 formed of a diaphragm and a fixed electrode facing each other.

Note that, as the condenser microphone units U1 and U2, back electret-type condenser microphone units are employed, in which the diaphragms in the condenser microphone units U1 and U2 are arranged on the same plane such that distances from a sound source are to be identical, and electret dielectric films are respectively arranged on the fixed electrodes.

Further, in the example illustrated in FIG. 1, a positive phase output from the first condenser microphone unit U1 is supplied to a grid of a first electron tube T1, and a reverse phase output from the second condenser microphone unit U2 is supplied to a grid of a second electron tube T2.

That is, in this example, the fixed electrode of the first condenser microphone unit U1 is connected to the grid of the first electron tube T1, and an electrode formed on the diaphragm is connected to a ground GND. Further, an electrode formed on the diaphragm of the second condenser microphone unit U2 is connected to the grid of the second electron tube T2, and the fixed electrode is connected to the ground GND.

The first electron tube T1 constitutes an electron tube circuit of grounded-plate type in which dc operating power +B is supplied to a plate, and a cathode is provided with an audio signal output terminal OUT (hereinafter, simply referred as output terminal OUT), and similarly to the example illustrated in FIG. 4, a self-biasing circuit, composed of a plurality of diodes D3 as a voltage dropping element and a by-pass capacitor C3, is connected to the cathode.

Then, a plurality of diodes D1 connected in series and a plurality of diodes D2 connected in series are connected in inverse parallel to each other between the grid of the first electron tube T1 and the cathode of the diodes D3. This configuration stabilizes a bias voltage applied to the grid of the electron tube T1, similarly to the example illustrated in FIG. 4.

The second electron tube T2 constitutes an electron tube circuit of grounded-cathode type in which a series circuit of the first electron tube and the self-biasing circuit is connected to a plate, and a cathode is directly connected to the ground GND.

Then, a resistor R3 is connected between the grid and the cathode (ground) of the second electron tube T2, and therefore, the grid and the cathode of the second electron tube T2 are maintained to have nearly the same potential.

Note that a plate current determined by a bias voltage obtained by the self-biasing circuit of the first electron tube T1 is supplied to the second electron tube T2 as an operating current. That is, the plate current of the second electron tube T2 is determined depending on the grid bias applied to the first electron tube T1.

As described above, the series circuit of the first electron tube T1 and the self-biasing circuit functions as a load of the second electron tube T2 that constitutes a electron tube circuit of grounded-cathode type, and a series circuit of the self-biasing circuit and the second electron tube T2 functions as a load of the first electron tube T1 that constitutes an electron tube circuit of grounded-plate type.

According to the configuration illustrated in FIG. 1, the positive phase output from the first condenser microphone unit U1 is supplied to the grid of the first electron tube T1, and a similar positive phase output appears in the output terminal OUT provided in the cathode of the first electron tube T1, with a converted impedance.

Meanwhile, the reverse phase output from the second condenser microphone unit U2 is supplied to the grid of the second electron tube T2, and a sink current at the plate of the second electron tube T2 is controlled upon receipt of the reverse phase output. Accordingly, the phase reverse output from the second condenser microphone unit U2, being subjected to phase inversion, appears at the plate of the second electron tube T2 and is sent to the output terminal OUT through the by-pass capacitor C3.

Therefore, the signal from the first condenser microphone unit U1 and the signal from the second condenser microphone unit U2 are added and outputted to the output terminal OUT with a converted impedance.

Therefore, according to the configuration illustrated in FIG. 1, the outputs of the first and second condenser microphone units U1 and U2 are added, and thus a condenser microphone having improved output sensitivity can be provided.

Figure 2:
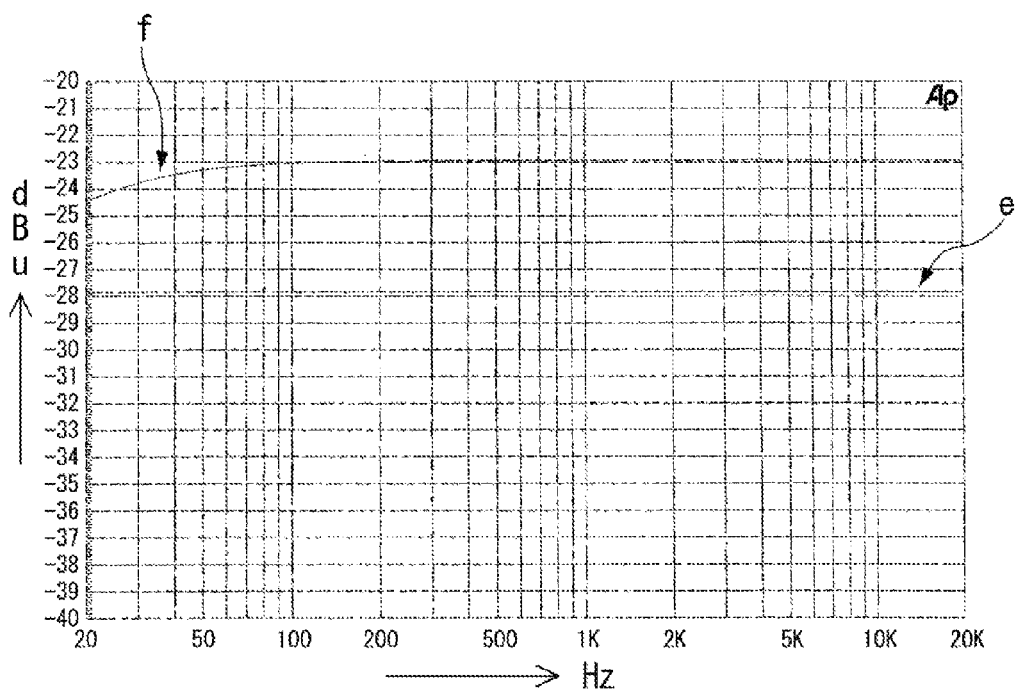
FIG. 2 is a frequency response characteristic diagram in the circuit configuration illustrated in FIG. 1.

FIG. 2 illustrates frequency response characteristics of the circuit configuration illustrated in FIG. 1, and the reference sign e denotes an input level ein1 from the first condenser microphone unit U1 supplied to the grid of the first electron tube T1, and an input level ein2 from the second condenser microphone unit U2 supplied to the grid of the second electron tube T2.

Further, the reference sign f illustrates the signal output level appearing in the output terminal OUT. As illustrated in the frequency response characteristics, the level illustrated by the reference sign f shows an increase of about 5 dB, compared with the level illustrated by the reference sign e.

This indicates that the input levels ein1 and ein2 are added and outputted by the circuit configuration illustrated in FIG. 1.

Figure 3:
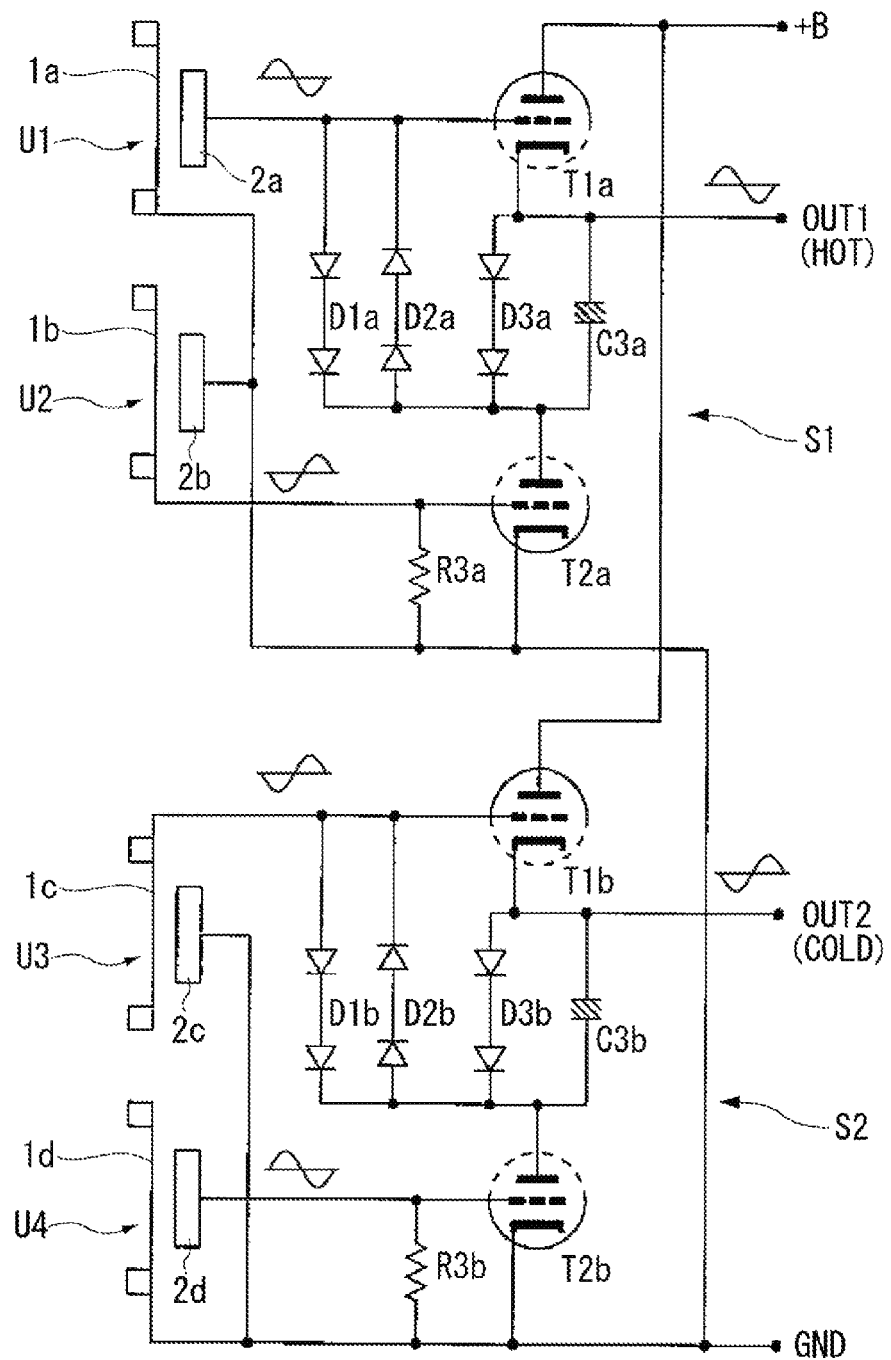
FIG. 3 is a circuit configuration diagram illustrating a second embodiment of a condenser microphone according to the present invention.

FIG. 3 illustrates an example in which two sets of circuit configurations illustrated in FIG. 1 is prepared, balanced output signals of a microphone can be outputted to a hot-side output terminal and a cold-side output terminal.

That is, upper half (first set S1) and lower half (second set S2) circuit configurations illustrated in FIG. 3 are the same as the circuit configuration illustrated in FIG. 1, and its functions are the same as the description with reference to FIG. 1.

Accordingly, respective units in the upper half (first set S1) circuit configuration illustrated in FIG. 3 are denoted such that a letter a is added to the last digits of the respective reference signs illustrated in FIG. 1, and respective units in the lower half (second set S2) circuit configuration are denoted such that a letter b is added to the last digits of the respective reference signs illustrated in FIG. 1.

Then, a positive phase output from a first condenser microphone unit U1 is supplied to a grid of a first electron tube T1$a$ in the first set S1, and a reverse phase output from a second condenser microphone unit U2 is supplied to a grid of a second electron tube T2$a$ in the first set S1. Further, a reverse phase output from a third condenser microphone unit U3 is supplied to a grid of a first electron tube T1$b$ in the second set S2, and a positive phase output from a fourth condenser microphone unit U4 is supplied to a grid of a second electron tube T2$b$ in the second set S2.

That is, in the example illustrated in FIG. 3, a fixed electrode 2$a$ of the first condenser microphone unit U1 in the first set S1 is connected to the grid of the first electron tube T1$a$, and an electrode coated on a diaphragm 1$a$ is connected to a ground GND. Further, an electrode coated on a diaphragm 1$b$ of the second condenser microphone unit U2 in the first set S1 is connected to the grid of the second electron tube T2$a$, and a fixed electrode 2$b$ is connected to the ground GND.

Further, an electrode coated on a diaphragm 1$c$ of the third condenser microphone unit U3 in the second set S2 is connected to the grid of the first electron tube T1$b$, and a fixed electrode 2$c$ is connected to the ground GND. Further, a fixed electrode 2$d$ of the fourth condenser microphone unit U4 in the second set S2 is connected to the grid of the second electron tube T2$b$, and an electrode coated on the diaphragm 1$d$ is connected to the ground GND.

Note that, as the first to fourth condenser microphone units U1 to U4, back electret-type condenser microphone units are employed, in which the diaphragms 1$a$, 1$b$, 1$c$, and 1$d$ in the first to fourth condenser microphone units U1 to U4 illustrated in FIG. 3 are arranged on the same plane such that distances from a sound source are identical, and electret dielectric films are respectively arranged on the fixed electrodes 2$a$, 2$b$, 2$c$, and 2$d$.

According to the configuration illustrated in FIG. 3, a signal from the first condenser microphone unit U1 and of a signal from the second condenser microphone unit U2, being subject to impedance conversion, are added and outputted to an output terminal OUT1 of the first set S1, similarly to the function described with reference to FIG. 1.

Similarly, a signal by the third condenser microphone unit U3 and a signal by the fourth condenser microphone unit U4, being subject to impedance conversion, are added and outputted to an output terminal OUT2 of the second set S2.

Then, signals having phases reverse to each other are led to the output terminals OUT1 and OUT2, as a hot-side output and a cold-side output, respectively, to form a balanced output.

Therefore, according to the configuration illustrated in FIG. 3, a condenser microphone that improves output sensitivity by adding the outputs of the condenser microphone units, and can output balanced output signals without using an output transformer for transforming microphone outputs into the balanced output signals can be provided.

What is claimed is:

1. A condenser microphone comprising:
   a grounded-plate first electron tube having a plate to which a direct current operating power is supplied, and a cathode provided with an output terminal;
   a self-biasing circuit including a voltage dropping element that is connected to the cathode of the first electron tube and that generates a grid bias voltage of the first electron tube by voltage drop with a cathode current; and
   a grounded-cathode second electron tube having a plate to which a series circuit of the first electron tube and the self-biasing circuit is connected as a load circuit, wherein
   a positive phase output signal from a first condenser microphone unit is supplied to a grid of the first electron tube, and a reverse phase output signal from a second condenser microphone unit is supplied to a grid of the second electron tube, and an added signal of the signal from the first condenser microphone unit and the signal from the second condenser microphone unit is outputted to an output terminal of the cathode in the first electron tube.

2. A condenser microphone according to claim 1, comprising:
   two sets of condenser microphones described in claim 1, wherein a positive phase output from the first condenser microphone unit is supplied to the grid of the first electron tube in a first set, and a reverse phase output from the second condenser microphone unit is supplied to the grid of the second electron tube in the first set, a reverse phase output from a third condenser microphone unit is supplied to the grid of the first electron tube in a second set, and a positive phase output from a fourth condenser microphone unit is supplied to the grid of the second electron tube in the second set, and balanced output signals of the microphones are outputted between an output terminal of the cathode of the first electron tube in the first set and an output terminal of the cathode of the first electron tube in the second set.

3. The condenser microphone according to claim 1, wherein
   a diode is used as a voltage dropping element that constitutes the self-biasing circuit, and a by-pass capacitor is connected in parallel with the diode.

4. The condenser microphone according to claim 2, wherein
   a diode is used as a voltage dropping element that constitutes the self-biasing circuit, and a by-pass capacitor is connected in parallel with the diode.

5. The condenser microphone according to claim 1, wherein
   each of the first electron tube and the second electron tube is one of a dual triode.

6. The condenser microphone according to claim 2, wherein
   each of the first electron tube and the second electron tube is one of a dual triode tube.

7. The condenser microphone according to claim 1, wherein
   diaphragms of the condenser microphone units are arranged on a same plane such that distances from a sound source are to be identical.

8. The condenser microphone according to claim 2, wherein
   diaphragms of the condenser microphone units are arranged on a same plane such that distances from a sound source are to be identical.

9. The condenser microphone according to claim 1, wherein
   the condenser microphone units are configured of back electret-type condenser microphone units including an electret dielectric film on a fixed electrode.

10. The condenser microphone according to claim 2, wherein
    the condenser microphone units are configured of back electret-type condenser microphone units including an electret dielectric film on a fixed electrode.

* * * * *